United States Patent
Day et al.

(10) Patent No.: US 7,256,623 B2
(45) Date of Patent: Aug. 14, 2007

(54) FREQUENCY PROGRAMMABLE FEED-FORWARD OSCILLATOR AND TRIANGLE WAVE GENERATOR

(75) Inventors: Brandon D. Day, Seattle, WA (US); James W. Leith, Seattle, WA (US); Gustavo J. Mehas, Mercer Island, WA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/925,744

(22) Filed: Aug. 25, 2004

(65) Prior Publication Data
US 2005/0200389 A1 Sep. 15, 2005

Related U.S. Application Data

(60) Provisional application No. 60/553,098, filed on Mar. 15, 2004.

(51) Int. Cl.
*H03C 3/00* (2006.01)
(52) U.S. Cl. ...................................... 327/101; 327/132
(58) Field of Classification Search ................ 327/101, 327/131, 113, 132, 126–128, 133–135
See application file for complete search history.

(56) References Cited

U.S. PATENT DOCUMENTS

| | | | | |
|---|---|---|---|---|
| 3,649,845 A | * | 3/1972 | Foch ........................... | 327/131 |
| 4,404,481 A | * | 9/1983 | Ide et al. .................... | 327/100 |
| 5,394,020 A | * | 2/1995 | Nienaber .................... | 327/140 |
| 5,502,419 A | * | 3/1996 | Kawasaki et al. .......... | 332/109 |
| 5,585,748 A | * | 12/1996 | Yamaguchi et al. ........ | 327/101 |
| 5,699,024 A | * | 12/1997 | Manlove et al. ............ | 331/111 |
| 6,018,370 A | * | 1/2000 | Nayebi et al. .............. | 348/525 |
| 6,163,190 A | * | 12/2000 | Takai et al. ................. | 327/205 |
| 6,392,494 B2 | * | 5/2002 | Takeyabu et al. ............ | 331/11 |
| 6,791,405 B2 | * | 9/2004 | Tsuji et al. ................... | 330/10 |
| 6,819,154 B2 | * | 11/2004 | Greenfeld ................... | 327/172 |
| 6,930,520 B2 | * | 8/2005 | Solie .......................... | 327/131 |

* cited by examiner

*Primary Examiner*—Timothy P. Callahan
*Assistant Examiner*—Hai L. Nguyen
(74) *Attorney, Agent, or Firm*—Howison & Arnott, L.L.P.

(57) ABSTRACT

A frequency programmable feed forward oscillator and triangular wave generator is disclosed having a first input for receiving an input voltage and a second input for receiving an input current. Circuitry within the device responsive to the input voltage scales the amplitude of a triangle wave form according to the provided input voltage and provides the scaled output voltage at a first output. In conjunction, the circuitry also generates a scaled PWM frequency responsive to the provided input current and provides this at a second output.

18 Claims, 4 Drawing Sheets

FREQUENCY PROGRAMMABLE FEED-FORWARD OSCILLATOR AND TRIANGLE WAVE GENERATOR

CROSS-REFERENCE TO RELATED APPLICATIONS

This application is claims priority to U.S. Provisional Patent Application Ser. No. 60/553,098, filed on Mar. 15, 2004 entitled "FREQUENCY PROGRAMMABLE FEED-FORWARD OSCILLATOR AND TRIANGLE WAVE GENERATOR"

TECHNICAL FIELD OF THE INVENTION

The present invention relates to oscillator and triangular wave form generators, and more particularly, to an oscillator and triangular wave form generator that can generate a triangular wave form whose amplitude is proportional to an input voltage and scales a pulse width modulated (PWM) frequency proportional to an input current.

BACKGROUND OF THE INVENTION

Oscillator and wave form generators may provide triangular wave forms or saw-tooth wave forms. Triangular wave forms are preferred over saw tooth wave forms because of the increased bandwidth and superior transient response. Existing oscillator and triangular wave form generators can scale a triangular wave form amplitude responsive to an input voltage or scale frequency to a fixed amplitude, but not both. However, existing oscillator and triangular wave form generators lack both PWM frequency programming capability and amplitude programmability. There is a need for an oscillator and triangular wave form generator that is capable of scaling a triangular wave form voltage amplitude output with an input voltage and also scale a PWM frequency proportional to a provided input current. The provision of a programmable frequency and scalable triangular wave form amplitude would provide a number of benefits in electronic circuit designs.

SUMMARY OF THE INVENTION

The present invention disclosed and claimed herein, in one aspect thereof, comprises an apparatus for scaling an amplitude of a triangle wave form while simultaneously scaling the output PWM frequency. A first input is provided for receiving an input voltage and a second input is provided for receiving an input current. Circuitry within the apparatus responsive to the input voltage scales the amplitude of an output voltage which is provided at a first output. Additionally, the circuitry provides a scaled output PWM frequency responsive to the input current at a second output.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
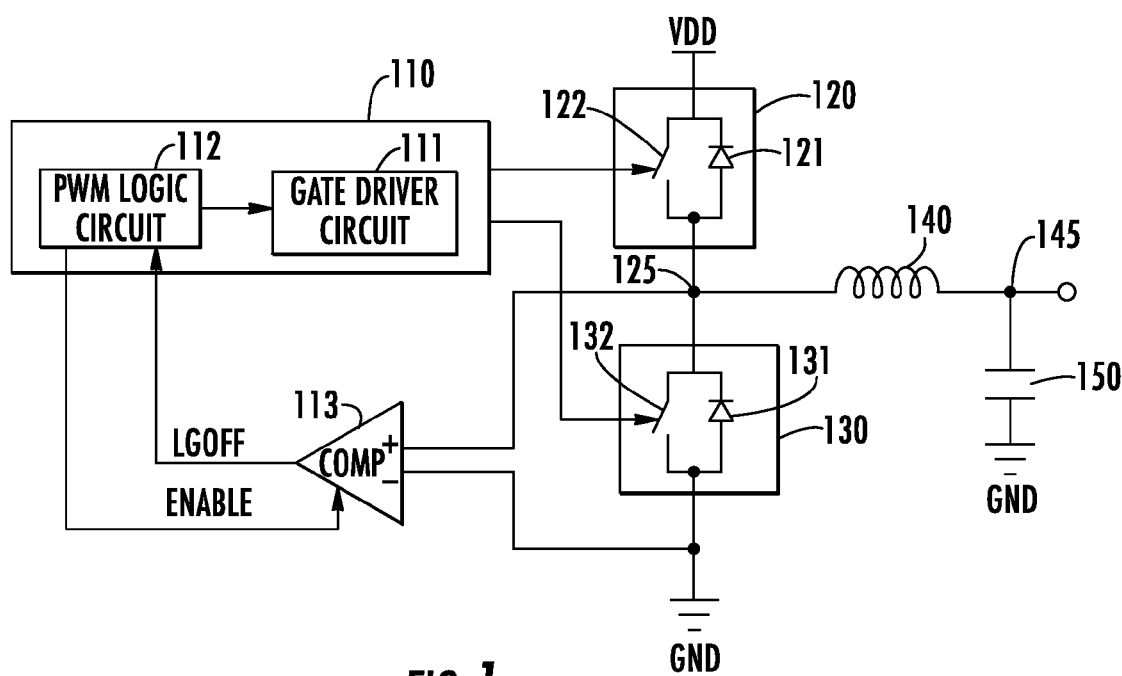
FIG. 1 is a block diagram of a DC-DC converter.

Referring now to the drawings, and more particularly to FIG. 1, wherein there is illustrated the general circuit configuration of a conventional DC-DC voltage converter as comprising a DC-DC controller 110, which fully controls the turn on and turn off of a pair of electronic power switching devices, respectively, shown as an upper FET pass element 120 and a lower FET pass element 130. These FET switching devices have their drain/source paths coupled in between first and second reference voltages VDD and ground (GND). Each pass element contains a controllable switch shown as an upper switch 122 and a lower switch 132. The upper pass element contains a body diode 121 in parallel with the drain/source path such that the reverse current flows through the body diode toward VDD. A lower pass element 130 contains a body diode 131 in parallel with the drain/source path such that the reverse current flows through body diode from ground. A common or phase voltage node 125 between the two power FETs 120/130 is coupled through an inductor 140 to a capacitor 150 coupled to a reference voltage (GND). The connection 145 between the inductor 140 and the capacitor 150 serves as an output node from which an output voltage $V_{OUT}$ is derived.

The DC-DC converter's controller 110 includes a gate driver circuit 111, that is operative to turn the two switching devices 120 and 130 on and off, in accordance with the periodic pulse signal wave form (typically, a pulse width modulation (PWM) switching wave form generated by a PWM logic circuit 112 which may include an oscillator and triangular wave form generator). The upper switch 122 is turned on and off by an upper gate switching signal UG applied by the gate driver 111 to the gate of the pass element 120, and the lower switch 132 is turned on and off by a lower gate switching signal LG applied to the gate driver 111 to the gate of the pass element 130.

Figure 2:
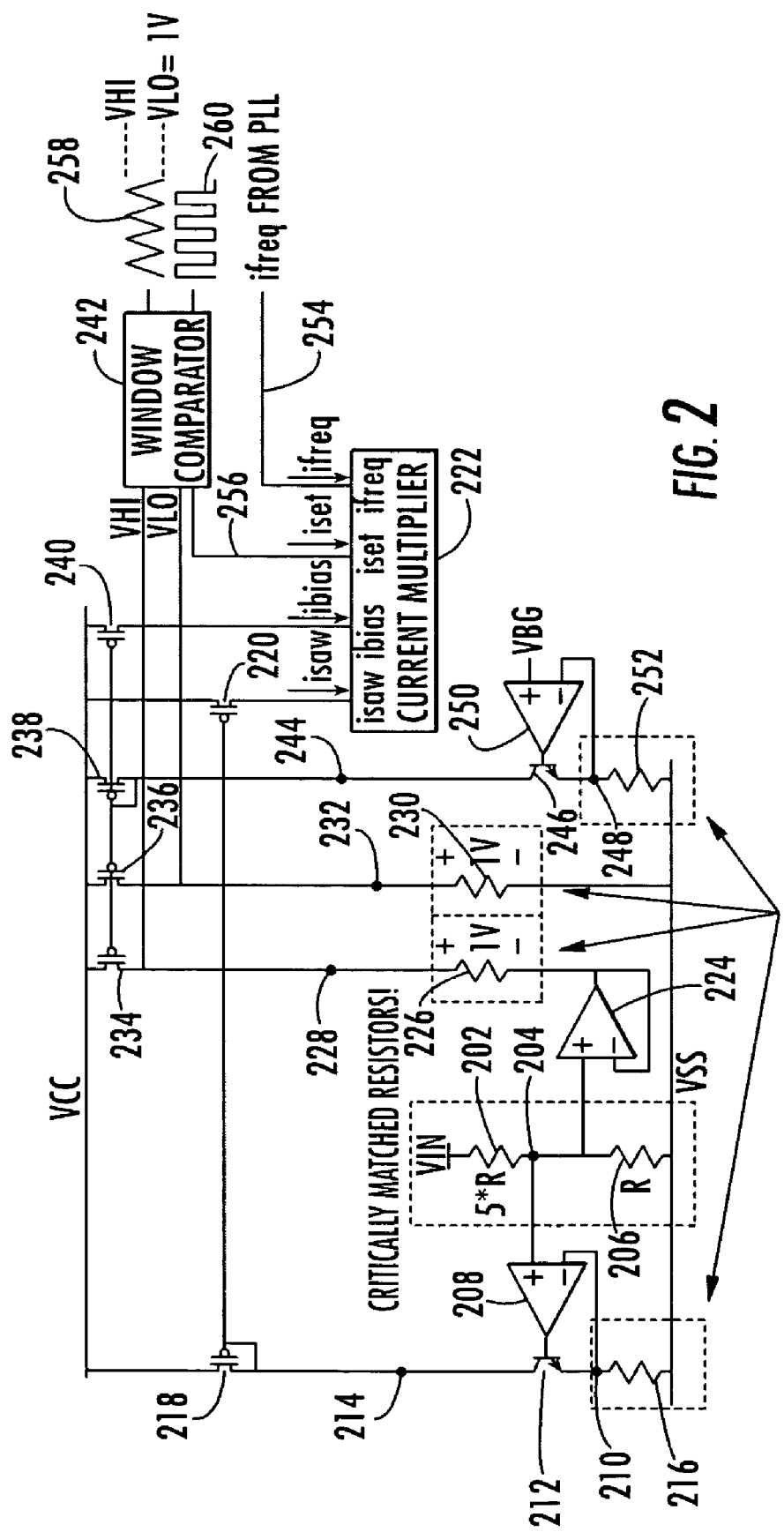
FIG. 2 is a schematic block diagram of an oscillator and triangular wave form generator capable of generating a triangular wave form proportional to a provided input voltage and for scaling a PWM frequency proportional to an input current.

Referring now to FIG. 2, there is disclosed an oscillator and triangular wave form generator according to the present disclosure for use with a DC-DC controller. The oscillator and triangular wave form generator includes input bias circuit, a current multiplier and window comparator. The input bias circuits create a current proportional to the input voltage and the triangular wave form peak-to-peak voltage. The current multiplier creates an output current proportional to the input voltage and an input current. The current multiplier uses two scalable current sources Isaw and Ifreq and a bias current Ibias to generate an output current Iset that is a multiplier of the two scalable currents. The two scalable current sources scale the triangle wave form amplitude and the output frequency. The output current is used to generate a triangular wave that scales propositional to input voltage and input frequency current. The window comparator compares the two voltage levels proportional to the input voltage to produce a triangular wave form and a PWM frequency.

An input voltage $V_{IN}$ is applied to a resistor divider circuit consisting of a first resistor 202 connected between the voltage input and a node 204 and a second resistor 206 connected between node 204 and VSS. The values of the resistors 202 and 206 are selected such that resistor 202 is five times the value of resistor 206. An error amplifier 208 has its positive input connected to node 204 and its negative input connected to node 210. The output of error amplifier 208 is connected to the base of a transistor 212. The transistor 212 has its collector/emitter path connected between nodes 214 and 210. A resistor 216 is located between node 210 and VSS. Transistor 218 has its drain/source path connected between VCC and node 214. The gate of transistor 218 is connected with transistor 220 in a current mirror configuration. The base of transistor 218 is also connected to node 214. The base of transistor 220 is connected to the base of transistor 218 and the drain/source path of transistor 220 is connected between VCC and the Isaw input of current multiplier 222.

A second error amplifier 224 has its positive input connected to node 204 and its negative input connected to its output. The output of error amplifier 224 is connected to one end of a resistor 226. The opposite side of resistor 226 is connected to node 228. A transistor 230 resides between node 232 and VSS. A transistor 234 has its drain/source path connected between VCC and node 228. The gate of transistor 234 is connected to the gates of transistors 236, 238 and 240, respectively. A window comparator 242 is connected to node 228 to receive a VHI input. The window comparator 242 is additionally connected to node 232 to receive a VLO input. Transistor 236 has its drain/source path connected between VCC and node 232. The gate of transistor 236 is also connected to the gate of transistors 234, 238 and 240. Transistor 238 has its drain/source pathway connected between VCC and node 244. The base of transistor 238 is connected to the base of transistors 236, 234 and 240 and to its source node at node 244. Transistor 240 has its drain/source path connected between VCC and the Ibias input of the current multiplier 222. The gate of transistor 240 connects to the gates of transistors 234, 236 and 238. The transistor 246 has its collector emitter path connected between node 244 and 248. The base of transistor 246 is connected to the output of error amplifier 250. The positive input of error amplifier 250 is connected to a band gap voltage output from a band gap generator and its negative input is connected to node 248. A register 252 is connected between node 248 and VSS. The current multiplier 222 additionally has an Ifreq input from a phase locked loop. The current multiplier 222 provides output current Iset on line 256 to the window comparator 242. The window comparator 242 generates a triangle wave form output 258 proportional to the input voltage VIN. Additionally, the window comparator 242 generates a square wave form PWM frequency 260 proportional to the input current Iset.

The input voltage VIN is used to scale the amplitude of the output triangle wave form 258. This is accomplished by the voltage divider circuit consisting of resistors 202 and 206 to which the input voltage is applied. One-sixth of the input is applied to the positive input of error amplifier 208 creating a current through node 214 that is mirrored as the Isaw current coming out of transistor 220 into the Isaw input of current multiplier 222. The Isaw current is proportional to the input voltage. The VHI input to the window comparator 242 is created using the output of error amplifier 224 which is offset by one volt by resistor 226 before being applied to the VHI input of the window comparator 242. The low voltage signal VLO is obtained by offsetting VSS by one volt and applying this to the VLO input of comparator 242.

The Ibias current applied to the Ibias input of the current multiplier 222 is generated by applying a high accuracy band gap voltage VBG to error amplifier 250. This generates a bias current through node 244, that is mirrored from transistor 240 into the Ibias input of the current multiplier 222.

The Ifreq current uses a resistor and band gap reference voltage to generate the Ifreq current from a phase locked loop on line 254. The Ifreq current is proportional to the square wave PWM frequency output 260 from the window comparator.

Figure 3:
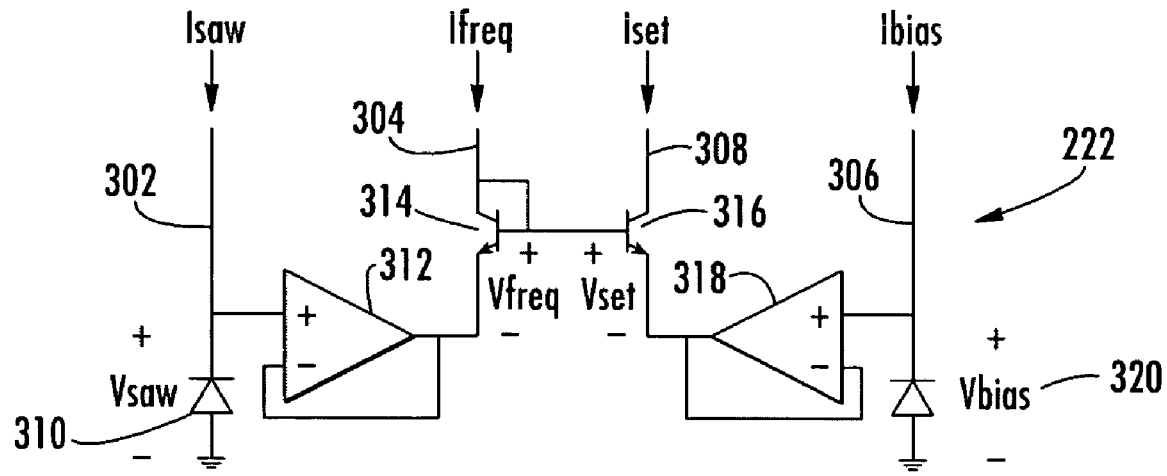
FIG. 3 is a diagram of a first embodiment of the current multiplier.

Referring now to FIG. 3, there is illustrated a first embodiment of the current multiplier 222. The current multiplier 222 receives the Isaw current via node 302 from transistor 238. The Ifreq current is applied to input node 304 from the phase locked loop, and the Ibias current is applied to input node 306. The Iset current to the windows comparator 242 is output from node 308. A diode 310 has its anode connected to ground and its cathode connected to node 302. A voltage Vsaw occurs across diode 310. Node 302 is also connected to the positive input of error amplifier 312 in an emitter follower configuration with the output of error amplifier 312 connected to its negative input. Transistor 314 has its collector/emitter path connected between node 304 and the input of error amplifier 312. The base of transistor 314 is connected to the base of transistor 316 and to its collector at node 304. Transistor 316 has its collector/emitter path connected between node 308 and the output of error amplifier 318 and is in a current mirror configuration with transistor 314. A voltage Vfreq is between the base of transistor 314 and the input of error amplifier 312. A voltage VSET resides between the base of transistor 316 and the input of error amplifier 318. The error amplifier 318 is in an emitter follower configuration with its negative input connected to its output, and the positive input of the error amplifier 318 connected to node 306. A diode 320 is connected such that its anode is connected to ground and its cathode is connected to the positive input of error amplifier 318 at node 306. A voltage VBIAS resides across diode 320.

Using Kirchhoff's Laws for the voltages residing within the current multiplier, the following equation may be derived.

$$VSAW + VFREQ = VSET + VBIAS$$

Using the base-emitter equations, the value for Iset may then be determined to be equal to:

$$ISET = IFREQ * ISAW / IBIAS$$

Figure 4:
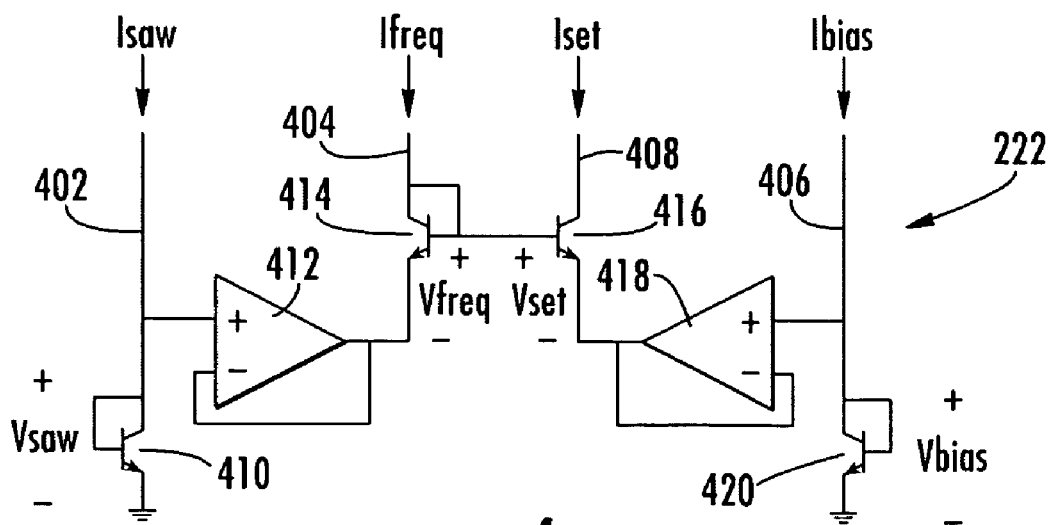
FIG. 4 is a diagram of a second embodiment of the current multiplier.

Referring now to FIG. 4, there is illustrated a second embodiment of the current multiplier 222. The current multiplier 222 receives the Isaw current via node 402 from transistor 238. The Ifreq current is applied to input node 404 from the phase locked loop, and the Ibias current is applied to input node 406. The Iset current to the windows comparator 242 is output from node 408. A transistor 410 has its emitter/collector path between node 402 and ground. The base of transistor 410 is connected to node 402. A voltage VSAW occurs across transistor 410. Node 402 is also connected to the positive input of error amplifier 412 in an emitter follower configuration with the output of error amplifier 412 connected to its negative input. Transistor 414 has its collector/emitter path connected between node 404 and the input of error amplifier 412. The base of transistor 414 is connected to the base of transistor 416 and to its collector at node 404. Transistor 416 has its collector/emitter path connected between node 408 and the output of error amplifier 418 and a current mirror configuration with transistor 414. A voltage VFREQ is between the base of transistor 414 and the input of error amplifier 412. A voltage VSET resides between the base of transistor 416 and the input of error amplifier 418. The error amplifier 418 is in an emitter follower configuration with its negative input connected to its output and the positive input of the error amplifier connected to node 406. A transistor 420 has it collector/emitter path between node 406 and ground. The base of transistor 420 is connected to node 406. A voltage VBIAS resides across transistor 420.

Using Kirchhoff's Laws for the voltages residing within the current multiplier, the following equation may be derived.

$$VSAW+VFREQ=VSET+VBIAS$$

Using the base/emitter equations, the value for Iset may then be determined to be equal to:

$$ISET=IFREQ*ISAW/IBIAS$$

Figure 5:
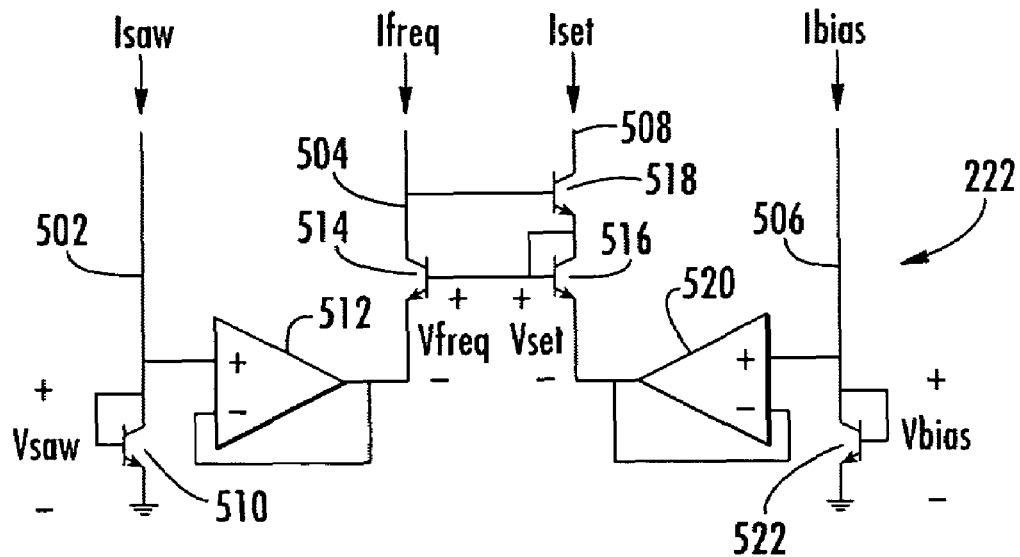
FIG. 5 is a diagram of a third embodiment of the current multiplier.

Referring now to FIG. 5, there is illustrated a third and preferred embodiment for the current multiplier 222. The Isaw current is applied to the current multiplier 222 through node 502. The Ifreq current is applied to the current multiplier 222 through node 504. The Ibias current is applied to the current multiplier 222 through node 506. The Iset current provided to the window comparator 242 via line 256 is output from a node 508. Transistor 510 is connected to the Isaw input node 502 and has its collector/emitter path connected between node 502 and ground. The base of transistor 510 is connected to its collector at node 502. A voltage VSAW resides across transistor 510. An error amplifier 512 has its positive input connected to node 502 and is connected in an emitter follower configuration with its output connected to its negative input. A transistor 514 has its collector/emitter path connected between node 504 and the output of error amplifier 512. A voltage VFREQ resides between the base of transistor 514 and the output of error amplifier 512. The base of transistor 514 is connected to the base of transistor 516. Transistor 516 has its collector connected to the emitter of transistor 518 and its emitter connected to the output of error amplifier 520. The base of transistor 516 is also connected to the collector of transistor 516. A voltage VSET resides between the base of amplifier 516 and the output of error amplifier 520. Transistor 518 has its collector emitter pathway connected between node 508 and the collector of transistor 516. The base of transistor 518 is connected to node 504. Error amplifier 520 is in an emitter follower configuration with its negative input connected to its output. The positive input of error amplifier 520 is connected to node 506. A transistor 522 has its collector/emitter pathway connected between node 506 and ground. The base of transistor 522 is connected to node 506. A voltage VBIAS resides across transistor 522. Using Kirchhoff's Laws, the following equation may be derived.

$$VSAW+VFREQ=VSET+VBIAS$$

Using the base/emitter equations, a value for Iset may be derived wherein:

$$ISET=IFREQ*ISAW/IBIAS$$

Figure 6:
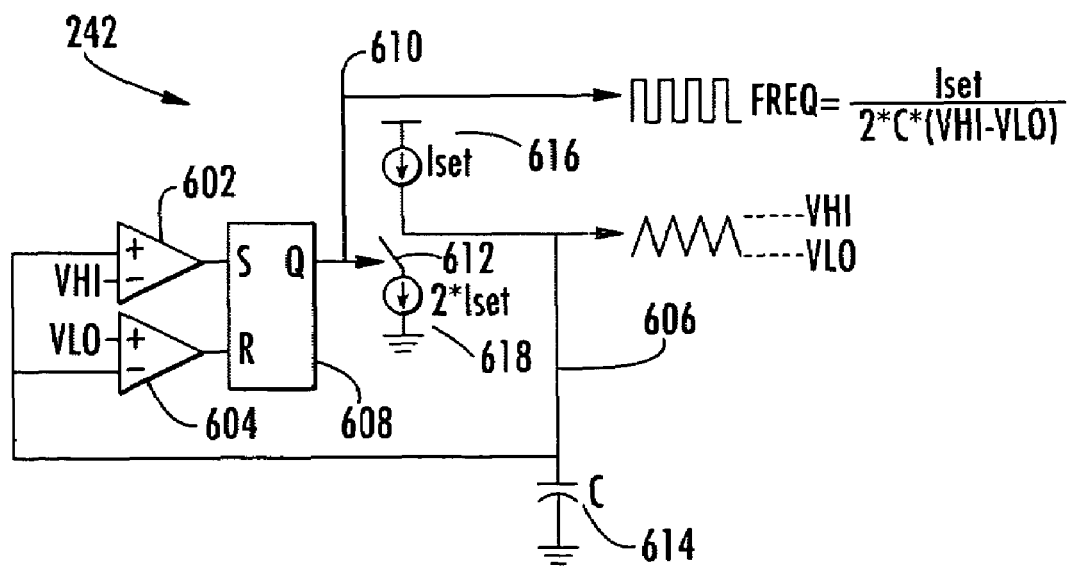
FIG. 6 is a diagram of the window comparator.

Referring now to FIG. 6, there is illustrated a schematic block diagram of the window comparator 242. The window comparator 242 compares the voltage of node 606 to the high and the low. The window comparator 242 has the VHI voltage applied to the negative input of an error amplifier 602. The VLO voltage is applied to the positive input of an error amplifier 604. The positive input of error amplifier 602 and the negative input of error amplifier 604 are connected to node 606. The output of error amplifier 602 is connected to the "S" input of latch 608. The output of error amplifier 604 is connected to the "R" input of latch 608. The "Q" output of latch 608 is connected to node 610, which provides a scaled square wave PWM frequency proportional to the input current Iset. The frequency is determined according to the equation:

$$FREQ=ISET \div [2*C*(VHI-VLO)]$$

A switch 612 switches between node 610 and node 606. A capacitor 614 is located between node 606 and ground. The switch 612 enables charging and discharging of capacitor 614 between VHI and VLO. The window comparator 242 provides a current sink and a current source. The current Iset is applied at 616 and a two times Iset is applied at 618.

Using the above described circuitry, a user has the capability of scaling the ramp amplitude proportional with an input voltage and to enable external programming capabilities to operate at different fixed frequencies as well as synchronizing to an external clock signal.

Although the preferred embodiment has been described in detail, it should be understood that various changes, substitutions and alterations can be made therein without departing from the spirit and scope of the invention as defined by the appended claims.

What is claimed is:

1. An oscillator and triangle wave generator, comprising:
   a first input for receiving an input voltage signal;
   a second input for receiving an input current signal;
   circuitry for generating a triangle wave form and an output PWM signal having a frequency, the circuitry scaling an amplitude of the triangle wave form responsive to the input voltage signal and further scaling the frequency of the output PWM signal responsive to the input current signal, wherein the circuitry further comprises:
   an input bias circuit for generating a first current, a second current, a first voltage proportional to the input voltage signal and a second voltage proportional to the input voltage signal;
   a current multiplier responsive to the first current, the second current and the input current signal for generating fourth current proportional to the input voltage signal; and
   a comparator circuit responsive to the first voltage proportional to the input voltage signal, the second voltage proportional to the input voltage signal and the fourth current for generating the triangle wave form and the output PWM signal;
   a first output for the triangle wave form having the scaled amplitude; and
   a second output for the output PWM signal.

2. The apparatus of claim 1, wherein the comparator generates the triangle wave form having an amplitude between the first voltage proportional to the input voltage signal and the second voltage proportional to the input voltage signal.

3. The apparatus of claim 1, wherein the comparator circuit compares the first voltage proportional to the input voltage signal and the second voltage proportional to the input voltage signal.

4. The apparatus of claim 1, wherein the current multiplier generates the fourth current as a multiplier of the first current and the second current.

5. The apparatus of claim 1, wherein the current multiplier generates the fourth current according to the equation:

$$I_{set}=I_{freq}*I_{saw}/I_{bias}$$

wherein $I_{set}$=the fourth current
$I_{freq}$=the first input current signal
$I_{saw}$=the second current
$I_{bias}$=the third first current.

6. The apparatus of claim 1, wherein the comparator generates the output PWM frequency according to the equation:

$$Freq = \frac{ISET}{2*C*(VHI-VLO)}$$

wherein Freq=PWM Frequency
Iset=the fourth current
C=capacitor value in comparator
VHI=the first voltage proportional to the input voltage signal; and
VLO=the second voltage proportional to the input voltage signal.

7. An apparatus, comprising:
a first input for receiving an input voltage;
a second input for receiving an input current;
an input bias circuit for generating a first current, a second current, a first voltage proportional to the input voltage and a second voltage proportional to the input voltage responsive to the input voltage;
a current multiplier responsive to the first current, the second current and the input current for generating a fourth current;
a comparator circuit responsive to the first voltage proportional to the input voltage, the second voltage proportional to the input voltage and the fourth current for generating a triangle wave form and an output PWM signal having a frequency, wherein an amplitude of the triangle wave form is scaled responsive to the input voltage and the frequency of the PWM output is scaled responsive to the input current;
a first output for the triangle wave form; and
a second output for the output PWM signal.

8. The apparatus of claim 7, wherein the comparator generates the triangle wave form having an amplitude between the first voltage proportional to the input voltage and the second voltage proportional to the input voltage.

9. The apparatus of claim 7, wherein the comparator circuit compares the first voltage proportional to the input voltage and the second voltage proportional to the input voltage.

10. The apparatus of claim 7, wherein the current multiplier generates the fourth current as a multiplier of the first current and the second current.

11. The apparatus of claim 7, wherein the current multiplier generates the fourth current according to the equation:

$$I_{set}=I_{freq}*I_{saw}/I_{bias}$$

wherein $I_{set}$=the fourth current
$I_{freq}$=the input current
$I_{saw}$=the second current
$I_{bias}$=the first current.

12. The apparatus of claim 7, wherein the comparator generates the output PWM frequency according to the equation:

$$Freq = \frac{ISET}{2*C*(VHI-VLO)}$$

wherein Freq=PWM Frequency
Iset=the fourth current
C=capacitor value in comparator
VHI=the first voltage proportional to the input voltage; and
VLO=the second voltage proportional to the input voltage.

13. A voltage converter, comprising:
an oscillator and triangle wave generator associated with the converter circuitry, comprising:
a first input for receiving an input voltage signal;
a second input for receiving an input current signal;
an input bias circuit for generating a first current, a second current, a first voltage proportional to the input voltage and a second voltage proportional to the input voltage responsive to the input voltage;
a current multiplier responsive to the first current, the second current and the input current for generating a fourth current;
a comparator circuit responsive to the first voltage proportional to the input voltage, the second voltage proportional to the input voltage and the fourth current for generating a triangle wave form and an output PWM signal having a frequency, wherein an amplitude of the triangle wave form is scaled responsive to the input voltage and the frequency of the PWM output is scaled responsive to the input current;
a first output for the triangle wave form having a scaled amplitude; and
a second output for the output PWM signal having a scaled frequency;
a gate drive circuit responsive to the triangle wave form and the output PWM signal for generating gate drive signals; and
a plurality of switch elements responsive to the gate drive signals.

14. The apparatus of claim 13, wherein the comparator generates the output PWM frequency according to the equation:

$$Freq = \frac{ISET}{2 \times C \times (VHI-VLO)}$$

wherein Freq =PWM Frequency
Iset=the fourth current
C=capacitor value in comparator
VHI=the first voltage proportional to the input voltage; and
VLO=the second voltage proportional to the input voltage signal.

15. The apparatus of claim 13, wherein the comparator generates the triangle wave form having an amplitude between the first voltage signal proportional to the input voltage and the second voltage proportional to the input voltage signal.

16. The apparatus of claim 13, wherein the comparator circuit compares the first voltage proportional to the input voltage signal and the second voltage proportional to the input voltage signal.

17. The apparatus of claim 13, wherein the current multiplier generates the fourth current as a multiplier of the first current and the second current.

18. The apparatus of claim 13, wherein the current multiplier generates the fourth current according to the equation:

$$I_{set} = I_{freq} * I_{saw} / I_{bias}$$

wherein $I_{set}$ = the fourth current
$I_{freq}$ = the input current signal
$I_{saw}$ = the second current
$I_{bias}$ = the first current.

* * * * *